(12) United States Patent
Yoshisato et al.

(10) Patent No.: US 6,603,667 B2
(45) Date of Patent: Aug. 5, 2003

(54) ELECTRONIC CIRCUIT UNIT THAT IS SUITABLE FOR MINIATURIZATION AND EXCELLENT IN HIGH FREQUENCY CHARACTERISTIC

(75) Inventors: Akiyuki Yoshisato, Fukushima-ken (JP); Kazuhiko Ueda, Fukushima-ken (JP); Akihiko Inoue, Fukushima-ken (JP); Hiroshi Sakuma, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 92 days.

(21) Appl. No.: 09/870,416

(22) Filed: May 29, 2001

(65) Prior Publication Data

US 2002/0011352 A1 Jan. 31, 2002

(30) Foreign Application Priority Data

May 30, 2000 (JP) ........................................ 2000-160278
Sep. 27, 2000 (JP) ........................................ 2000-294671

(51) Int. Cl.[7] ................................................. H05K 7/06
(52) U.S. Cl. ........................ 361/782; 361/765; 361/777
(58) Field of Search ................................. 361/734, 738, 361/765, 766, 777, 780, 782, 783, 792, 794; 257/703, 782, 783, 784; 438/118, 119; 333/185, 247; 330/66, 67

(56) References Cited

U.S. PATENT DOCUMENTS 5,272,590 A * 12/1993 Hernandez ............... 361/306.2
5,629,563 A * 5/1997 Takiar et al. ................ 257/723
5,825,628 A * 10/1998 Garbelli et al. ............. 361/763
6,020,219 A * 2/2000 Dudderar et al. ........... 438/118
6,124,636 A * 9/2000 Kusamitsu ................... 257/728
6,147,876 A * 11/2000 Yamaguchi et al. ......... 361/766
6,320,757 B1 * 11/2001 Liu ............................. 361/760
6,356,455 B1 * 3/2002 Carpenter .................... 361/793
6,404,649 B1 * 6/2002 Drake et al. ................. 361/782

FOREIGN PATENT DOCUMENTS

JP      Hei 6-53406      2/1994

* cited by examiner

*Primary Examiner*—John B. Vigushin
(74) *Attorney, Agent, or Firm*—Brinks Hofer Gilson & Lione

(57) ABSTRACT

The invention provides an electronic circuit unit that is suitable for miniaturization and excellent in high frequency characteristic. Capacitors and a wiring pattern are formed on an alumina substrate by means of thin film forming technique, and a part of the wiring pattern is served as the connection land for mounting a bare chip of a transistor. Among the capacitors, the top electrode of the capacitor is served also as a part of the connection land, and the bottom side collector electrode of the bare chip is connected to the connection land by use of conductive adhesive. Top electrodes of the residual capacitors are served as the bonding pad, and the base electrode and the emitter electrode on the top side of the bare chip are connected to the top electrodes of the respective capacitors by a wire.

6 Claims, 10 Drawing Sheets

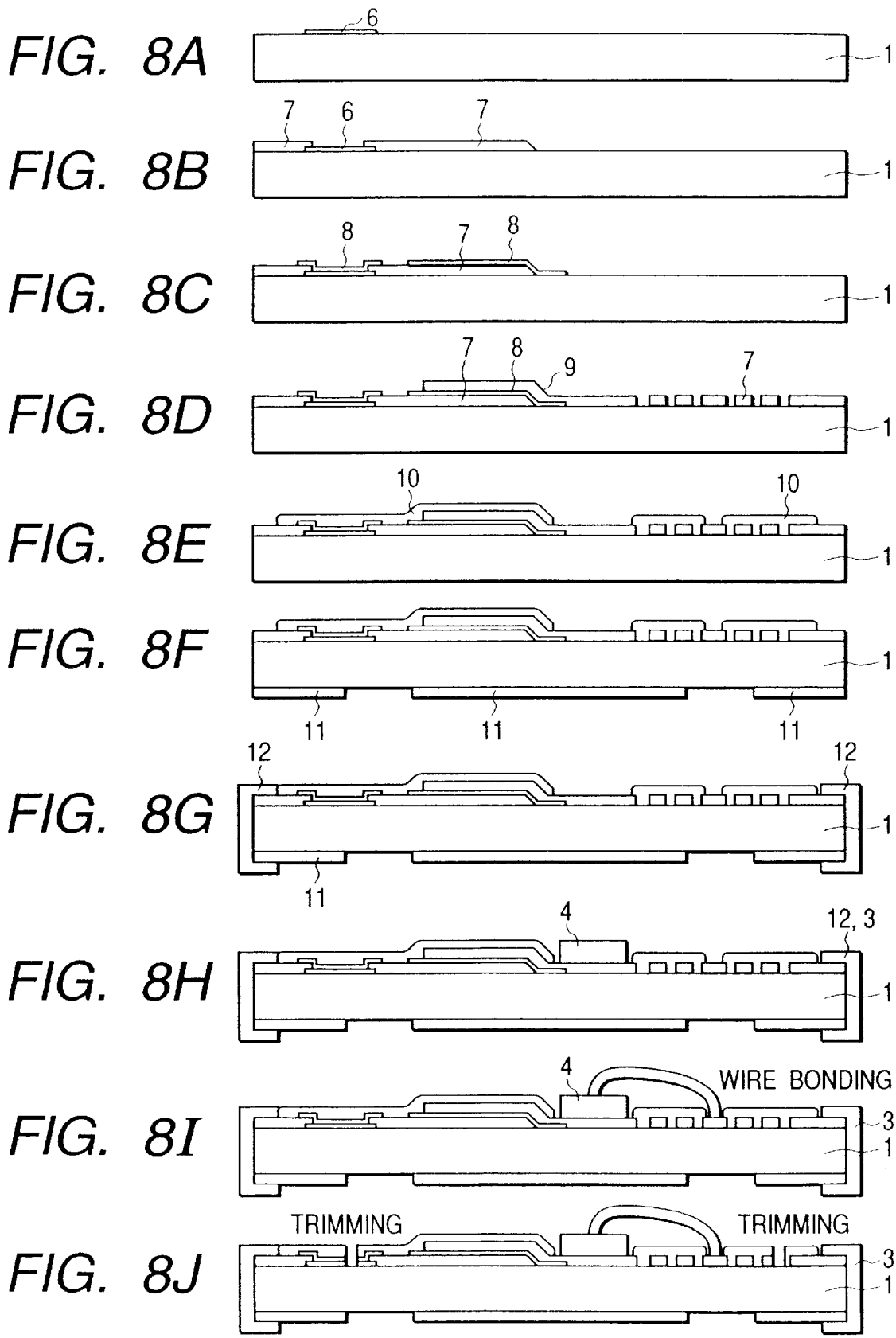

ELECTRONIC CIRCUIT UNIT THAT IS SUITABLE FOR MINIATURIZATION AND EXCELLENT IN HIGH FREQUENCY CHARACTERISTIC

BACKGROUND OF THE INVENTION

1. Field of the Invention

This invention relates to a surface mounting type electronic circuit unit on which a semiconductor bare chip and a capacitor are mounted, and particularly relates to an electronic circuit unit that is suitably used as a high frequency device.

2. Description of the Related Art

Generally, an electronic circuit unit used as a high frequency device is fabricated by soldering various circuit parts such as chip resistors and chip capacitors on soldering land of conducting patterns formed on a substrate. However, a small-sized electronic circuit unit fabricated by forming thin film circuit elements on a substrate by means of thin film forming technique has been developed with recent progress of integrated circuit fabrication technology.

In the case where a circuit structure required for an electronic circuit unit includes, for example, a transistor and a plurality of capacitors, a method is employed in which a plurality of thin film capacitors and a wiring pattern are formed on a substrate by means of thin film forming technique and a transistor bare chip is mounted and wire-bonded on a substrate. Herein, the thin film capacitor is formed by laminating a bottom electrode, a dielectric layer, and a top electrode successively, and a part of a wiring pattern is served as the bottom electrode and top electrode. Furthermore, the bottom side collector electrode of a transistor is connected to a connection land with conductive adhesive, the top side emitter electrode and base electrode are connected to a bonding pad with a wire, and the wiring pattern is served also as the connection land and bonding pad.

Recently, the technique for miniaturizing the circuit parts such as chip parts and transistor has been progressed markedly, and for example, the ultra-small chip resistor and chip capacitor having an apparent size of approximately 0.6×0.3 mm have been used practically. Therefore, it is possible that such small-size chip parts and transistor are used for the above-mentioned convention electronic circuit unit and are mounted on a substrate with narrow pitch between circuit parts to thereby miniaturize the electronic circuit unit to a certain extent. However, the miniaturization of the circuit parts such as chip parts and transistor is limited, and narrowing of the pitch between parts is limited because many circuit parts should be mounted on a substrate so that soldered portions of individual circuit parts are prevented from short-circuiting. These limitations have prevented further miniaturization of the electronic circuit unit.

Furthermore, according to the above-mentioned conventional electronic circuit unit, the electronic circuit unit can be miniaturized to some extent because at least a plurality of capacitors are formed on a substrate by means of thin film forming technique, however, because a plurality of capacitors and wiring patterns are formed in the limited area on a substrate by means of thin film forming technique, it is difficult to miniaturize the electronic circuit unit further.

Furthermore, in the case where an electronic circuit unit of this type has an amplifier circuit and the emitter of a transistor used as an amplifier circuit is grounded through a capacitor, a method in which the bottom electrode or top electrode of a thin film capacitor is connected to a bonding pad through a wiring pattern and the emitter electrode is connected to the bonding pad by means of wire bonding has been employed in the above-mentioned conventional art. This method is disadvantageous because the high frequency characteristic can be poor due to the inductance of the wiring pattern interposed between the thin film capacitor and bonding pad.

The present invention has been accomplished in view of the problem of the conventional art, and it is the object of the present invention to provide an electronic circuit unit that is suitable for miniaturization and excellent in high frequency characteristic.

SUMMARY OF THE INVENTION

As the first means of the present invention to achieve the above-mentioned object, an electronic circuit unit of the present invention comprises a conducting pattern formed on an alumina substrate by means of thin film forming technique, circuit elements including capacitors, resistors, and inductance elements formed on the alumina substrate by means of thin film forming technique so as to be connected to the conducting pattern, and a semiconductor bare chip fixed to the conductive pattern by means of wire bonding, wherein the area of the connection land on which the semiconductor bare chip is mounted is smaller than the bottom surface area of the semiconductor bare chip.

According to the above-mentioned structure, because circuit elements including capacitors, resistors, and inductance elements are formed with high precision by means of thin film forming technique and a semiconductor bare chip is fixed by means of wire bonding, necessary circuit parts are mounted in high density on an alumina substrate and a surface mounting type electronic circuit unit that is suitable for miniaturization is realized. Furthermore, because the area of the connection land on which the semiconductor bare chip is mounted is smaller than the bottom surface area of the semiconductor bare chip, conductive adhesive applied on the connection land such as cream solder or conducting paste can be retained inside the contour of the semiconductor bare chip, and it is prevented that the conductive adhesive spews from the contour of the semiconductor bare chip to result in short-circuit to the surrounding conducting pattern.

In the above-mentioned structure, it is desirable that at least two sides of the rectangular bare chip are located apart from the contour of the connection land. Thereby, the conductive adhesive can be retained inside the contour of two sides of the semiconductor bare chip, spewing of the conductive adhesive is prevented more effectively.

Furthermore, in the above-mentioned structure, it is desirable that an opening is formed in the connection land. Thereby, the excessive conductive adhesive can be retained in the opening, and spewing of the conductive adhesive is more surely prevented.

Furthermore, as the second means to achieve the above-mentioned object, an electronic circuit unit of the present invention has the structure in which a capacitor is formed by laminating a bottom electrode and top electrode with interposition of a dielectric material on a substrate, and a semiconductor bare chip is mounted so as to be located on the capacitor on the substrate, wherein the top electrode of the capacitor is served as a part of a connection land connected to the bottom side electrode of the semiconductor bare chip.

According to the structure as described hereinabove, because the thin film capacitor is formed just under the space where the semiconductor bare chip is mounted, the areal efficiency of the substrate is improved because the semiconductor bare chip and thin capacitor are placed one on the other, and the electronic circuit unit made even more small-sized. Furthermore, because the top electrode of the thin film capacitor is served also as a part of the connection land that is connected to the bottom side electrode of the semiconductor bare chip, the lead inductance component between the thin film capacitor and the semiconductor bare chip is reduced, and the deterioration of high frequency characteristic is prevented.

As another means to achieve the above-mentioned object, the electronic circuit unit of the present invention has the structure in which a capacitor is formed by laminating a bottom electrode and a top electrode with interposition of a dielectric material on a substrate, and a semiconductor bare chip is mounted on the substrate, wherein the top electrode of the capacitor is connected to the top side electrode of the semiconductor bare chip by means of wire bonding.

According to the above-mentioned structure, because the top side electrode of the semiconductor bare chip is wire-bonded by use of the top electrode of the thin film capacitor as a bonding pad, the areal efficiency of the substrate is improved by the area corresponding to the bonding pad, and the electronic circuit unit can be further miniaturized. Furthermore, because the top electrode of the thin film capacitor is served also as the bonding pad that is wire-bonded to the top side electrode of the semiconductor bare chip, the lead inductance between the thin film capacitor and the semiconductor bare chip is reduced, and the deterioration of high frequency characteristic is prevented.

BRIEF DESCRIPTION OF THE DRAWINGS

FIG. 8A to FIG. 8J are explanatory views illustrating fabrication process of the electronic circuit unit.

DETAILED DESCRIPTION OF THE PREFERRED EMBODIMENTS

Figure 1:
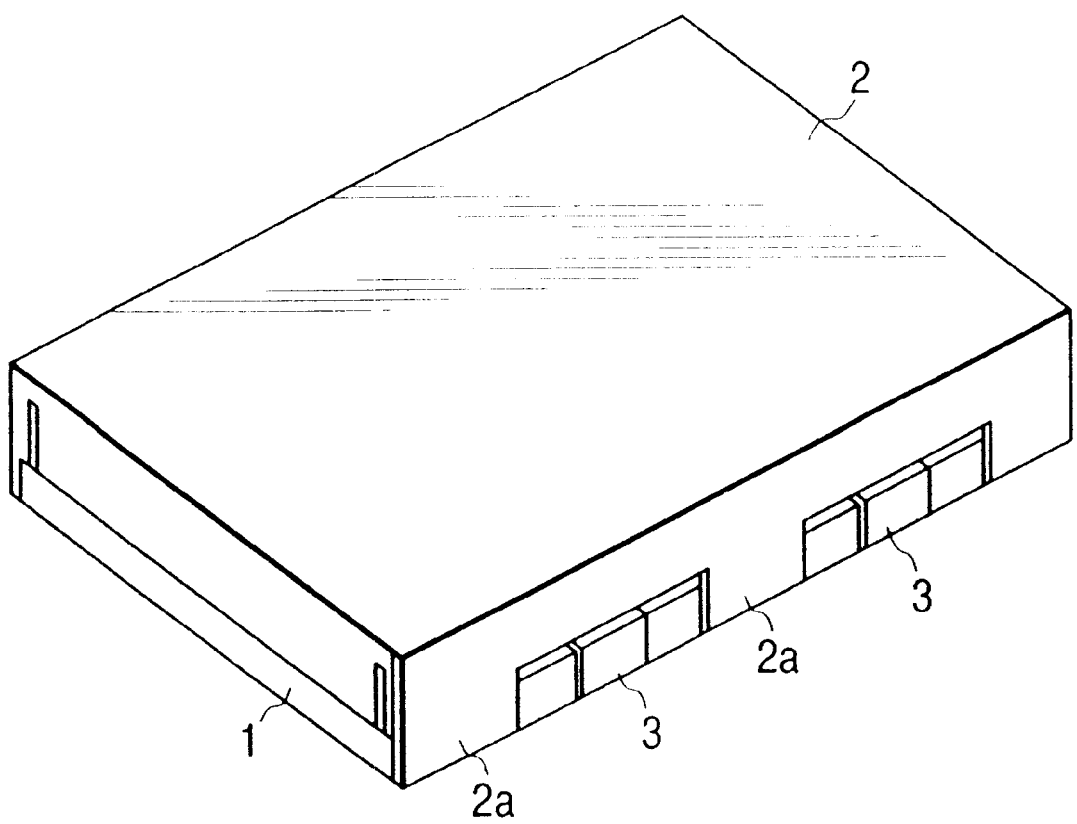
FIG. 1 is a perspective view of an electronic circuit unit in accordance with an embodiment of the present invention.
Figure 4:
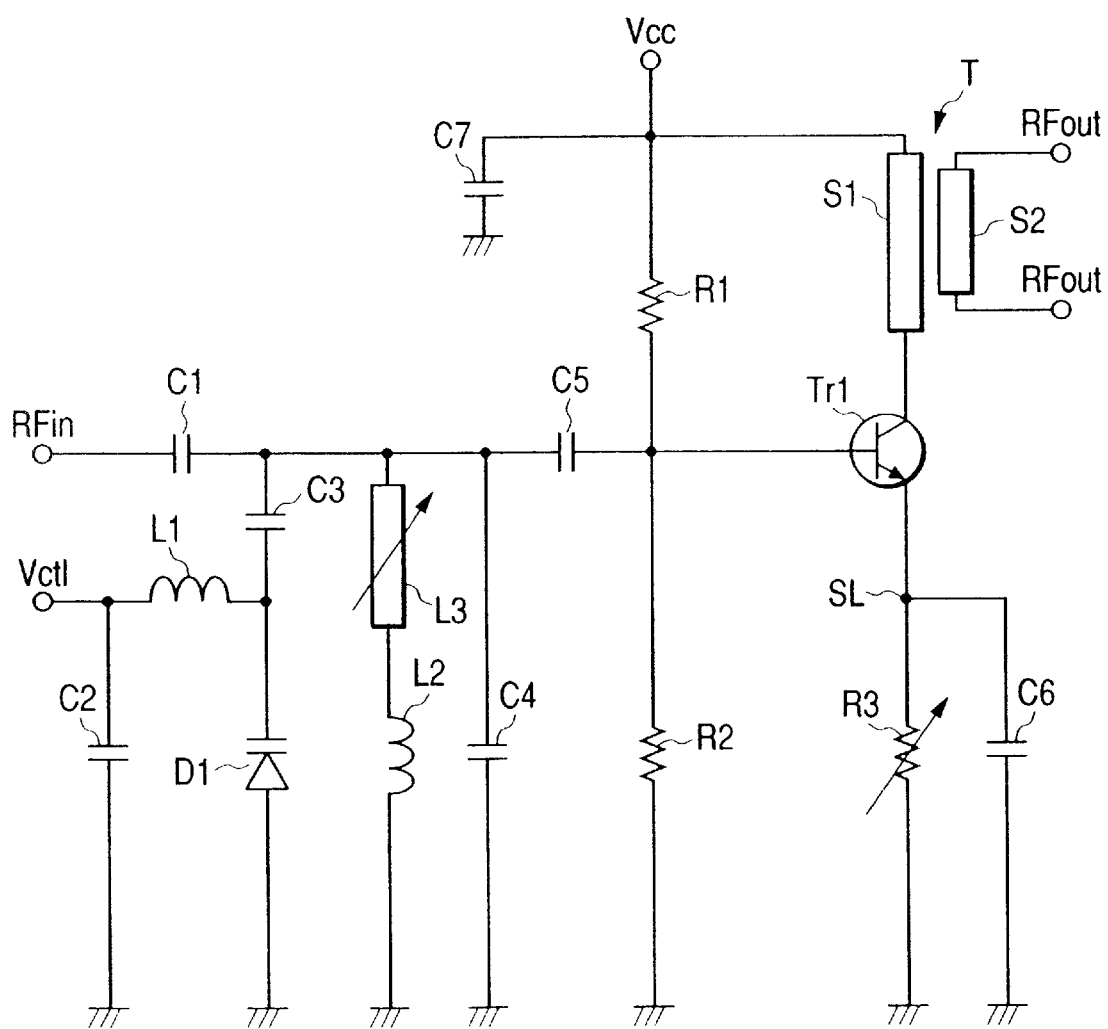
FIG. 4 is an explanatory view of the circuit structure.
Figure 5:
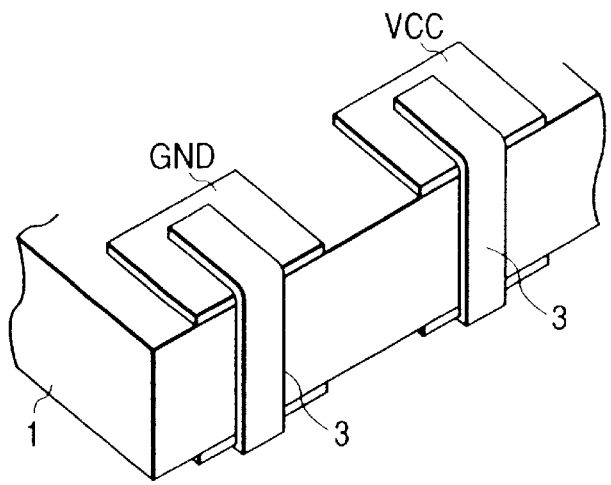
FIG. 5 is a perspective view illustrating end side electrodes.
Figure 6:
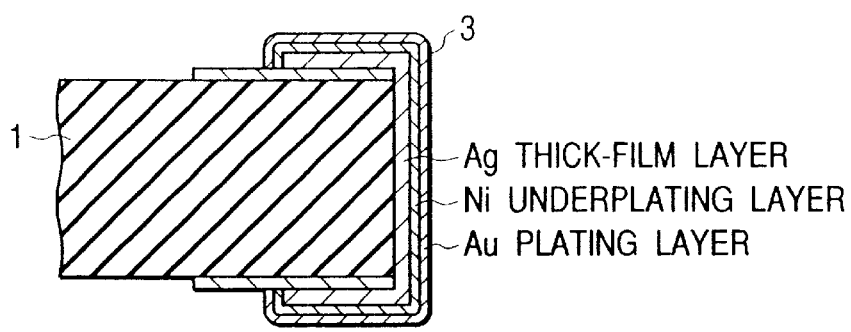
FIG. 6 is a cross sectional view of an end side electrode.

The first embodiments of the present invention will be described in detail hereinafter with reference to the drawings. FIG. 1 is a perspective view of an electronic circuit unit, FIG. 2 is a plan view of an alumina substrate illustrating the circuit structure layout, FIG. 3 is a backside view of the alumina substrate, FIG. 4 is an explanatory view of the circuit structure, FIG. 5 is a perspective view illustrating end side electrodes, FIG. 6 is a cross sectional view of an end side electrode, FIG. 7A and FIG. B are explanatory views illustrating the relation between a semiconductor bare chip and a connection land, and FIG. 8A to FIG. 8J are explanatory views illustrating a fabrication process of an electronic circuit unit.

The present embodiment is an example in which the present invention is applied to a frequency tuning type booster amplifier, the frequency tuning type booster amplifier is used for improving the reception performance (particularly for improvement of the reception sensitivity and anti-disturbance characteristic) of a potable type television apparatus in combination with a UHF tuner. Thereby, a TV signal of a desired frequency is selected, and the selected TV signal is amplified and supplied to the UHF tuner.

FIG. 1 shows an apparent configuration of such frequency tuning type booster amplifier (electronic circuit unit). As shown in FIG. 1, the frequency tuning type booster amplifier comprises an alumina substrate 1 on which circuit component elements are mounted, that will be described hereinafter, and a shield cover 2 fixed to the alumina substrate 1. The frequency tuning type booster amplifier will be used as a surface mounting parts that is to be soldered to a mother substrate not shown in the drawing. The alumina substrate 1 is configured in a rectangular flat plate, which is obtained by cutting a large substrate into divided rectangles and by dividing a divided rectangle further into small pieces. The shield cover 2 is formed by bending a metal plate into a box, and the circuit component element on the alumina substrate 1 is covered by the shield cover 2.

Figure 2:
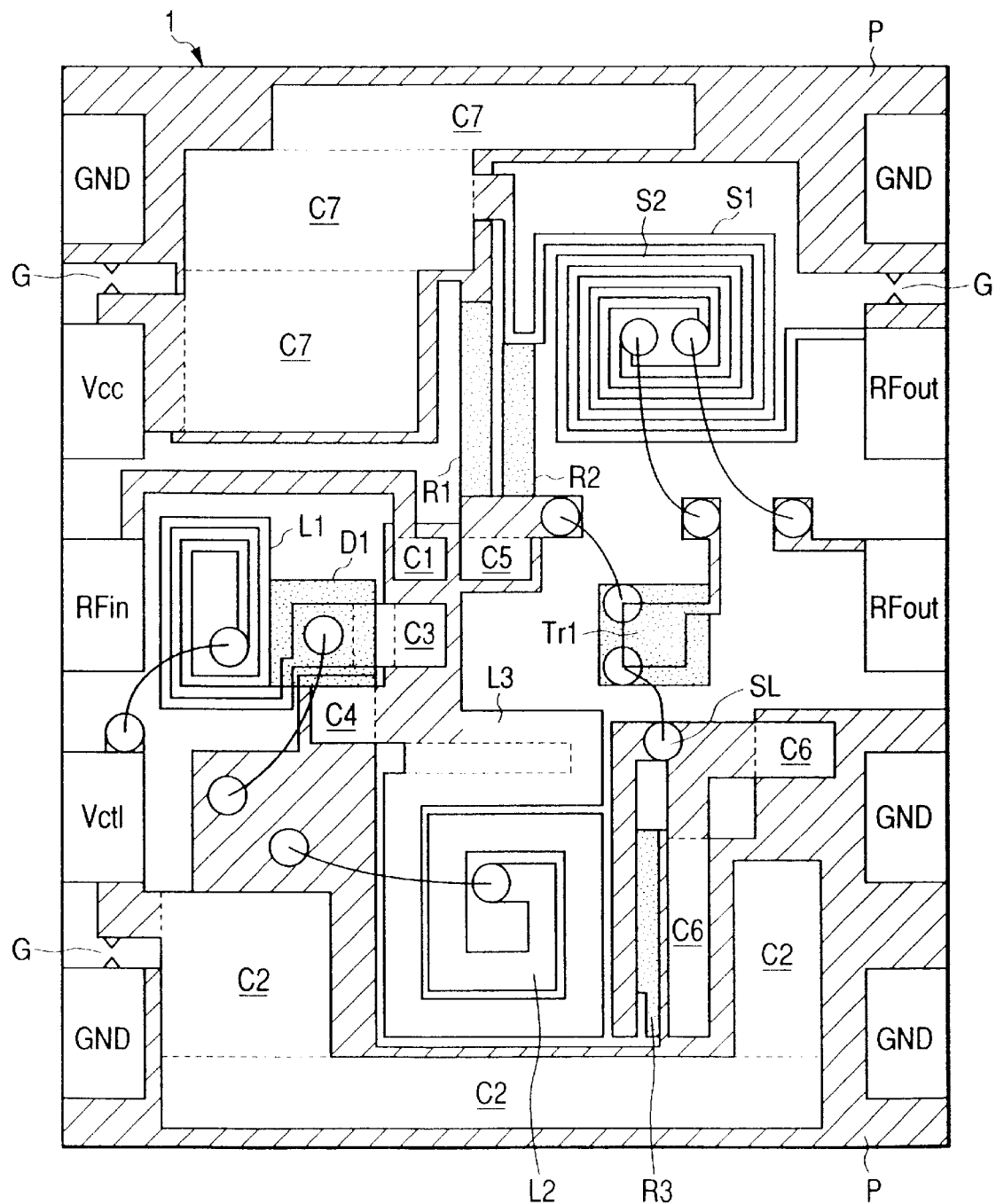
FIG. 2 is a plan view of an alumina substrate illustrating the circuit structure layout.
Figure 3:
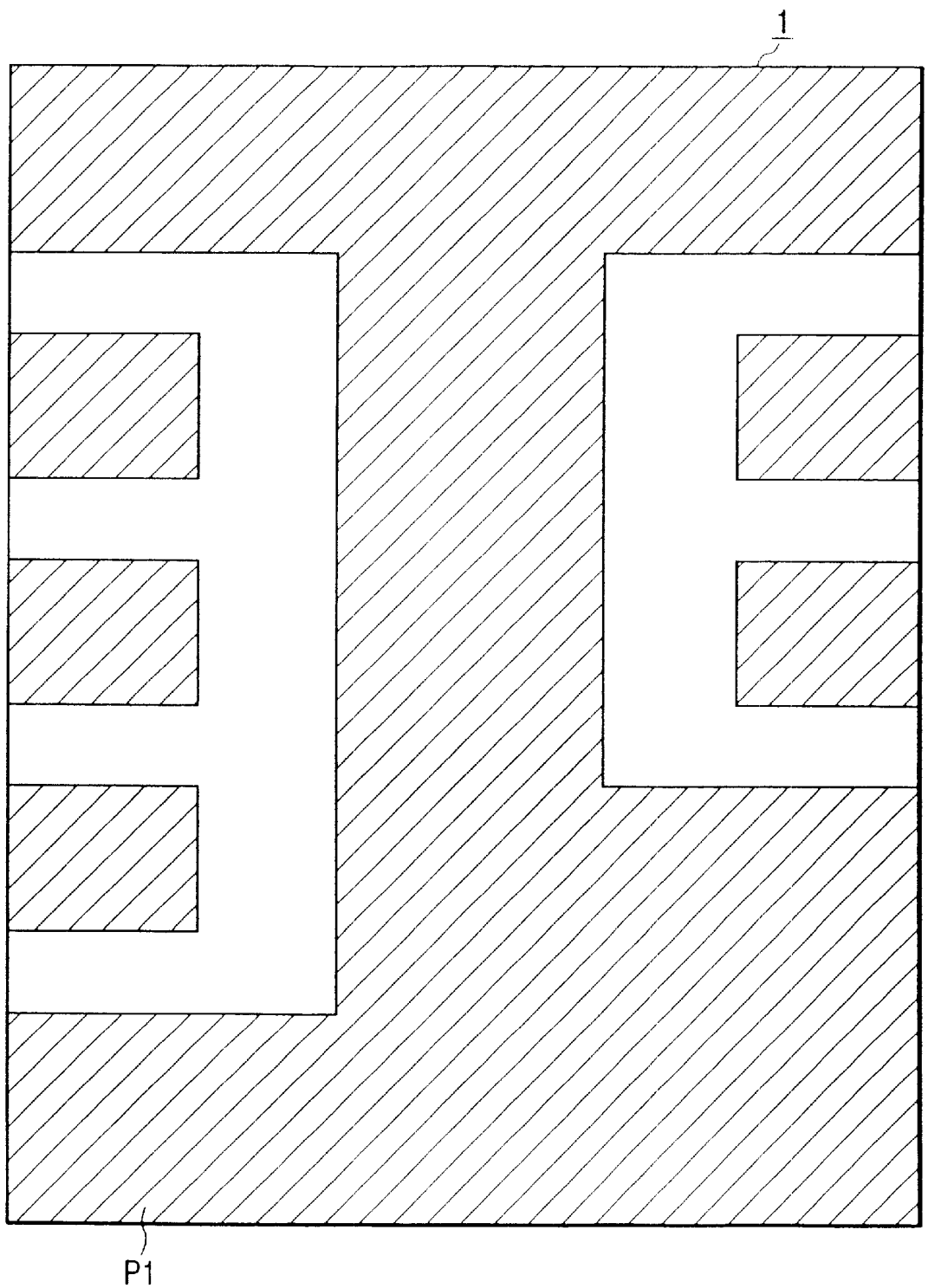
FIG. 3 is a backside view of the alumina substrate.

As shown in FIG. 2, the circuit component elements and a conducting pattern that is served to connect the circuit component elements are provided on the surface of the alumina substrate 1, and as shown in FIG. 3, a conducting pattern that is served as a backside electrode is provided on the backside of the alumina substrate 1. The frequency tuning type booster amplifier in accordance with the present embodiment having the circuit structure as shown in FIG. 4 is provided with a tuning circuit and amplifier circuit for selecting a TV signal and amplification respectively, and the same characters of the circuit diagram shown in FIG. 4 are given to the same circuit component elements shown in FIG. 2. However, FIG. 4 shows only an example of the circuit structure, and the present invention is applied to other electronic circuit units having the circuit structure different from the above-mentioned circuit structure.

As shown in FIG. 4, the frequency tuning type booster amplifier has capacitors C1 to C7, resistors R1 to R3, inductance elements L1 to L3, a diode D1, a transistor Tr1, and conducting paths S1 and S2 that are served as the circuit component element of the tuning circuit and amplifier circuit, and these circuit component elements and the conducting pattern are provided on the surface of the alumina substrate 1. The conducting pattern is formed of, for example, Cr or Cu by means of thin film forming technique such as spattering, and is shown with hatching having a character P in FIG. 2.

The circuit structure of the frequency tuning type booster amplifier will be described briefly hereunder. The frequency tuning type booster amplifier is provided with the tuning circuit comprising inductance elements L2 and L3, capacitors C3 and C4, and the diode D1 and the amplifier circuit comprising the transistor Tr1, peripheral circuit elements (resistors R1 to R3, capacitor C6), and a unbalance/balance conversion element T to select and amplify a TV signal of a desired frequency. The TV signal of a plurality of frequencies is supplied to the tuning circuit through the capacitor C1. The tuning frequency (resonance frequency) of the tuning circuit is variable by controlling a voltage (Vctl) applied on the cathode of the diode D1, only the desired TV signal is selected by adjusting the tuning frequency to the frequency of the desired TV signal, and the TV signal is supplied to the base of the transistor Tr1 of the amplifier circuit through the capacitor C5. Bias voltages are applied to base bias voltage dividing resistances R1 and R2 of the base of the transistor Tr1, and the collector current (emitter current) of the transistor Tr1 is set depending on the resistance value of the emitter resistance R3. The TV signal that has been amplified by means of the transistor Tr1 is sent out from the collector where the unbalance/balance conversion element T is provided. The unbalance/balance conversion element T has an inductance element comprising a pair of conducting paths S1 and S2 that are combined together. The balance TV signal is generated from both ends of the conducting path S2, and supplied to the above-mentioned UHF tuner.

As shown in FIG. 2, ground electrodes (GND) and input electrodes (Vcc, Vctl, and RFin) and output electrodes (RFout) are formed on the ends of the alumina substrate 1, the conducting pattern P is partially served as these electrodes. The ground electrodes, input electrodes, and output electrodes are formed only on two longer sides of the rectangular alumina substrate 1 that are facing each other and are not formed on the two shorter sides that are facing each other. In detail, GND electrodes are formed on both corners of one longer side of the alumina substrate 1, and a Vcc electrode, an RFin electrode, and a Vctl electrode are formed between these GND electrodes. Three GND electrodes are formed on both corners of the other longer side of the alumina substrate 1 and near one corner, and two RFout electrodes are formed between these GND electrodes. As described hereinafter, the two longer sides of the alumina substrate 1 correspond to the parting line used when a large substrate is cut into divided rectangles, and the two shorter sides of the alumina substrate 1 correspond to the parting line used when a divided rectangle is further divided into small pieces.

On the other hand, as shown in FIG. 3, the conducting pattern P1 (backside electrode) formed on the back side of the alumina substrate 1 is facing to the ground electrodes (GND), input electrodes (Vcc, Vctl, and RFin), and output electrodes (RFout), and corresponding electrodes are rendered conductive through side end electrodes 3 as shown in FIG. 5 and FIG. 6. An end electrode 3 is formed by plating an Ni under layer and an Au layer successively on an Ag thick-film layer. The undermost thick film Ag layer has been formed by forming a thick film of Ag paste containing no glass composition and then by sintering it at a temperature of approximately 200° C. Therefore, the undermost thick film Ag layer is formed of low temperature sintered material. The Ni under layer laminated in-between is served for firm adhering of the Au plating layer, and the uppermost Au plating layer is served for preventing deposition of Ag of the undermost layer on solder when the end side electrode 3 is soldered to a soldering land of a mother substrate not shown in the drawing. In the completed product of the electronic circuit unit formed by mounting the shield cover 2 on the alumina substrate 1, legs 2a formed by bending the shield cover 2 on the side are soldered to the end side electrodes 3 that are conductive to the ground electrodes (GND), and the shield cover 2 is grounded at the four corners of the alumina substrate 1.

Each of the capacitors C1 to C7 among the above-mentioned circuit component elements is formed by laminating a top electrode on a bottom electrode with interposition of a film of dielectric material such as $SiO_2$, and these thin films are formed by means of spattering. A Cu layer is formed on the surface of the top electrode and the Cu layer is effective to improve Q of the resonance circuit. The top electrode and the bottom electrode of each of the capacitors C1 to C7 is connected to the conducting pattern P, and discharging neighboring gaps (air gap) G are formed between the capacitor C7 and the Vcc electrode on the conducting pattern P, between the capacitor C7 and the RFout electrode on the conducting pattern P, and between the capacitor C2 and the Vctl electrode on the conducting pattern P. Each of these neighboring gaps G is formed of a pair of projections provided on the parallel conducting patterns P facing each other, and the tips of both projections are facing each other with interposition of a certain gap. In this case, the dimensional precision of the conducting pattern P and the GND electrode is very high because of the thin film forming technique, the gap dimensional size of the neighboring gap can be made very small, and discharging can occur at a low voltage. Among the capacitors C1 to C7, the capacitors C1 and C3 to C5 are formed simply rectangular, but the capacitors C2 and C7 are formed complexly non-rectangular with combination of two or more rectangles. In detail, the capacitor C2 has a concave shape having two rectangles projected from one side of another rectangle, and the capacitor C7 has a shape formed by three rectangles that are located continuously with a deviation in the longitudinal direction successively. These capacitors C2 and C7 are served as the ground capacitor for which a relatively large capacitance value is required, the ground capacitors C2 and C7 are formed complexly non-rectangular as described hereinabove because the limited space on the alumina substrate 1 is effectively used, and the capacitor of a desired capacitance value can be mounted in high density.

Furthermore, among the capacitors C1 to C7, the capacitor C6 comprises two ground capacitors having difference capacitance values, and the two capacitors are connected in parallel with interposition of a pair of conducting pattern P that are separated from each other. In detail, as shown in FIG. 2, one electrode of each of both ground capacitors C6 is connected to the ground conducting pattern P connected to the GND electrode, and the other electrode of each of both ground capacitors C6 is connected to a connection land SL of the transistor Tr1 with interposition of the two conducting patterns P that are separated from each other. As it is obvious from FIG. 4, the capacitor C6 is located between the emitter of the transistor Tr1 and the ground, and the above-mentioned connection land SL is the portion where the emitter electrode of the transistor Tr1 is subjected to wire bonding. Therefore, the capacitance value of the capacitor C6 is set by two ground capacitors connected in parallel with interposition of the conducting patterns P that are separated from each other. As the result, the inductance of the whole conducting patterns P extending from the emitter electrode of the transistor Tr1 to the ground with interposition of the capacitor C6 is reduced, and the grounding effect of the connection land SL that is brought about by means of the ground capacitor C6 is improved. Furthermore, the parasitic oscillation frequency due to the ground capacitors C6 and conducting patterns P becomes higher. Therefore, the parasitic oscillation is prevented by setting the frequency to a value equal to or higher than the operating point frequency of the transistor Tr1.

The resistors R1 to R3 are resistance films formed of, for example, $TaSiO_2$ by means of thin film forming technique such as sputtering, and a film of dielectric material such as $SiO_2$ is formed on the surface of a resistor as required. As shown in FIG. 2, the resistors R1 and R2 among the three film resistors R1 to R3 are located adjacently in parallel each other on the alumina substrate 1, and another film resistor R3 is located apart from the resistors R1 and R2. Because the film resistors R1 and R2 are formed adjacently, the ratio of the whole dispersion of the resistors R1 and R2 can be equalized even though the resistance value of the resistors R1 and R2 deviates from the desired value. As it is obvious from FIG. 4, the resistors R1 and R2 are served as the base bias voltage dividing resistor of the transistor Tr1, a voltage of $R1/(R1+R2) \times Vcc$ is applied on the base of the transistor Tr1. Herein, because the ratio of the whole dispersion of the resistors R1 and R2 that are served as the base bias voltage dividing resistor is equal each other always as described hereinabove, trimming of the resistance value of the resistors R1 and R2 is not required. On the other hand, the resistor R3 is the emitter resistance of the transistor Tr1, and a current flows from the Vcc electrode to the collector and emitter of the transistor Tr1 and is grounded through the resistor R3. Because the contribution of the resistor R3 to the amplification of the transistor Tr1 is largest among the resistors R1 to R3, only the resistor R3 is trimmed so that the current value is made constant for output adjustment.

Figure 9:
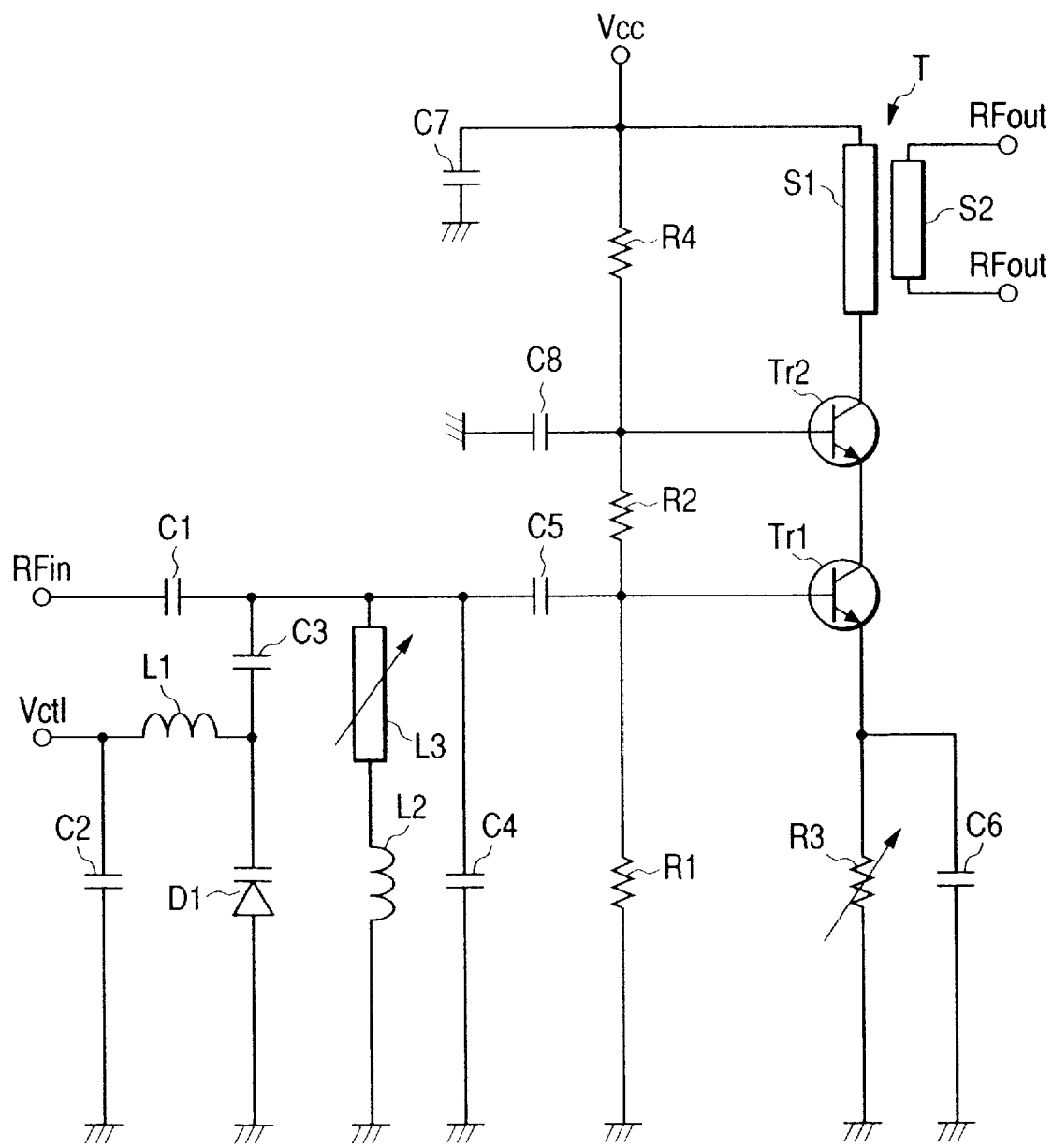
FIG. 9 is an explanatory view of another circuit structure.

As shown in FIG. 9, in the case of the circuit structure in which another transistor Tr2 is connected to the transistor Tr1 in series, the thin film resistors R1, R2, and R4 that are served as the base bias voltage dividing resistor of both transistors Tr1 and Tr2 are formed adjacently to each other on the alumina substrate 1, as the result trimming of the resistance value of the resistors R1, R2, and R4 is not required. Therefore, also in this case, the current value of both transistors Tr1 and Tr2 can be set by trimming only the resistor R3 that is served as the emitter resistance.

Furthermore, the inductance elements L1 to L3 and the conducting paths S1 and S2 are formed of Cr or Cu by means of thin film forming technique such as sputtering, and connected to the conducting pattern P. A Cu layer is formed on each of the inductance elements L1 to L3, and the Cu layer is effective to increase Q of a resonance circuit. Each of the inductance elements L1 and L2 is formed rectangularly swirlingly, and one end of each of the inductance elements L1 and L2 is wire-bonded to the Vctl electrode or ground conducting pattern P. The inductance element L2 is served to roughly set the resonance frequency, and the inductance element L3 is connected to the other end of the inductance element L2. The inductance element L3 is an adjusting conducting pattern served to adjust the resonance frequency. The inductance element L3 is trimmed as shown in FIG. 2 with a broken line to thereby increase the number of turns of the inductance element L2, and as the result the resonance frequency is adjusted. In this case, if the conductor width of the trimmed inductance element L3 is equalized to the conductor width of the inductance element L2 that is served for setting the resonance frequency, the characteristic impedance of the inductance element L2 is resultantly equalized to the characteristic impedance of the inductance element L3.

Figure 10:
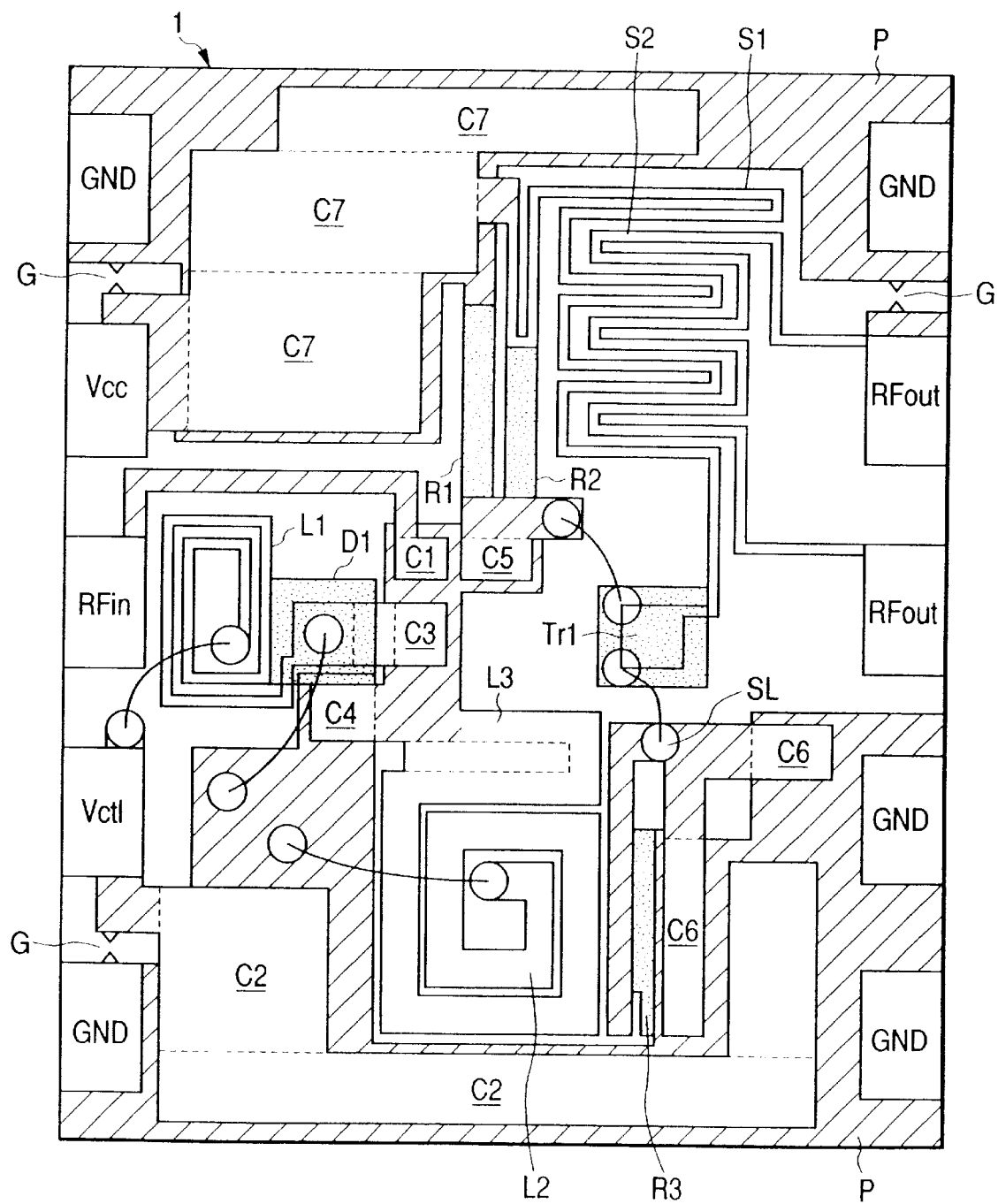
FIG. 10 is a plan view of an alumina substrate illustrating another circuit structure layout.

As described hereinbefore, the unbalance/balance conversion element T has the inductance element comprising the pair of conducting paths S1 and S2 combined, and these thin film conducting paths S1 and S2 are formed on the alumina substrate 1. These conducting paths S1 and S2 are formed swirlingly on the alumina substrate 1 facing each other with interposition of a predetermined gap, both ends of the one conducting path S1 are connected to the collector electrode of the transistor Tr1 and the conducting pattern P connected to the capacitor C7, and both ends of the other conducting path S2 are connected to a pair of RFout electrodes. In this case, because the dimensional precision of the thin film conducting paths S1 and S2 is high, the gap between both conducting paths S1 and S2 can be made narrow and the desired sufficient coupling can be secured resultantly, and the small unbalance/balance conversion element T is disposed on a limited space on the alumina substrate 1. As shown in FIG. 10, the pair of conducting paths S1 and S2 facing each other with interposition of the predetermined gap may be formed in zigzag fashion on the alumina substrate 1.

Figure 7A:
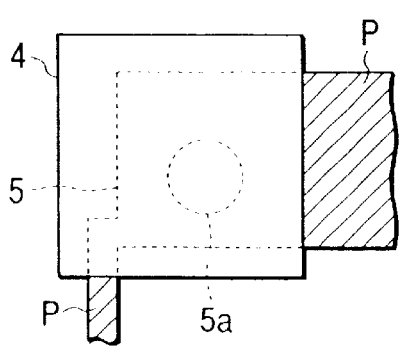
FIG. 7A and FIG. 7B are explanatory views illustrating the relation between a semiconductor bare chip and a connection land.
Figure 7B:
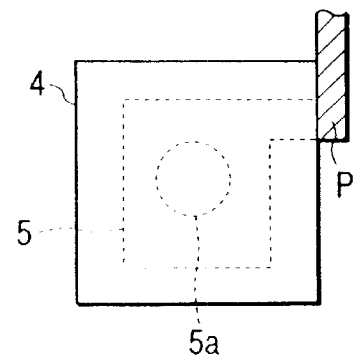

Furthermore, the diode D1 and transistor Tr1 are formed by means of a process in which a semiconductor bare chip is mounted on the connection land of the thin film conducting pattern P formed on the alumina substrate 1 and the semiconductor bare chip is connected to the conducting pattern P by means of wire bonding. In detail, as shown in FIG. 2, the semiconductor bare chip of the diode D1 is formed rectangular, the one electrode disposed on the bottom surface of the semiconductor bare chip is fixed to the connection land by use of conductive adhesive such as cream solder or conductive paste, and the other electrode disposed on the top surface of the semiconductor bare chip is connected to the predetermined position on the conducting pattern P by means of wire bonding. Furthermore, the semiconductor bare chip of the transistor Tr1 is formed also rectangular, the collector electrode disposed on the bottom surface of the semiconductor bare chip is fixed to the connection land by use of conductive adhesive, and the base electrode and the emitter electrode are connected to the predetermined position on the conducting pattern P by means of wire bonding. As in the case of the above-mentioned end side electrode 3, an Ni underplating layer and an Au plating layer are laminated successively on each of these connection lands. Herein, as shown in FIG. 7A and FIG. 7B, the connection land 5 is formed so that the area of the connection land 5 is smaller than the bottom surface area of the semiconductor bare chip 4, and a space for retaining conductive adhesive is secured under the semiconductor bare chip 4 because of such a structure. As the result, the space does not allow conductive adhesive from spewing outside the semiconductor bare chip 4 to result in short-circuit to the surrounding conducting pattern P. Furthermore, an opening 5a is formed in the connection land 5 and excessive conducting adhesive is retained in the opening 5a. Therefore, spewing of conductive adhesive is more surely prevented.

Next, the fabrication process of an electronic circuit unit structured as described hereinabove will be described mainly with reference to FIG. 8A to FIG. 8J.

At first, as shown in FIG. 8A, a $TaSiO_2$ film is formed on the entire surface of an alumina substrate 1 by means of sputtering and then etched in desired configuration to form a resistance film 6. Thereby, portions corresponding to the resistors R1 to R3 are formed. Next, as shown in FIG. 8B, Cr film or Cu film is formed on the resistance film 6 by means of sputtering and then etched in desired configuration to form the bottom electrode 7. A $SiO_2$ film is formed on the bottom electrode 7 by means of sputtering and then etched in desired configuration to form the dielectric film 8. Next, as shown in FIG. 8D, a Cr film or Cu film is formed on the dielectric film 8 by means of sputtering and then etched in desired configuration to form the top electrode 9. As the result, the area corresponding to the conducting pattern P, inductance elements L1 to L3, and conducting paths S1 and S2 is formed by the bottom electrode 7 or the top electrode 9, and the area corresponding to the capacitors C1 to C7 is formed by the laminate comprising the bottom electrode 7, dielectric film 8, and top electrode 9. Next, a Cu layer is formed on the surface of the area corresponding to the inductance elements L1 to L3, conducting paths S1 and S2, and capacitors C1 to C7 by means of plating or thin film forming technique, and a protecting film 10 is formed on the area excluding the area of the conducting pattern P as shown in FIG. 8E. Next, as shown in FIG. 8F, a Cr film or Cu film is formed on the entire back surface of the alumina substrate 1 by means of sputtering, and then etched in desired configuration to form the backside electrode 11. Thereby, the area corresponding to the backside conducting pattern P1 is formed.

Steps described with reference to FIG. 8A to FIG. 8F are carried out on a large substrate consisting of alumina material on which notch grooves extending in vertical direction and horizontal direction in lattice fashion are formed. On the other hand, steps described with reference to FIG. 8G to FIG. 8J are carried out on each divided rectangular piece obtained by cutting along notch grooves extending in one direction.

In detail, the large substrate is cut into divided rectangular pieces, then, as shown in FIG. 8G, thick film Ag layers 12 are formed on both end sides of the alumina substrate 1, which are cut surfaces of the divided piece, and the ground electrodes (GND), input electrodes (Vcc, Vctl, and RFin), and output electrodes (RFout) of the conducting patterns P and P1 disposed on both front and back surface of the alumina substrate 1 are connected conductively with the Ag layers 12. The Ag layer 12 corresponds to the Ag thick-film layer of the end side electrode 3, which is formed of low temperature sintered material consisting of Ag paste including no glass composition. The thick film forming step for forming the Ag layer 12 can be carried out on one rectangular divided piece. However otherwise, the step may be carried out on a plurality of divided pieces that are stacked with interposition of a small space between adjacent pieces, and as the result the thick film Ag layer 12 is formed on a plurality of divided pieces simultaneously. This method is suitable for mass-production. Next, Ni under layer and Au layer are formed successively by means of plating on the Ag layer 12 and the surfaces of the connection lands where the semiconductor bare chip is to be mounted. Thereafter as shown in FIG. 8H, the semiconductor bare chip of the diode D1 and transistor Tr1 is fixed on the connection lands by use of conductive adhesive such as cream solder or conductive paste. In this case, because the area of the connection land is smaller than the bottom surface area of the semiconductor bare chip as described hereinabove, spewing of conductive adhesive from the semiconductor bare chip is prevented, and as the result undesired short-circuit between the conductive adhesive and the conducting pattern P that is surrounding the semiconductor bare chip is prevented. Next, as shown in FIG. 8J, each semiconductor bare chip is fixed to the predetermined position of the conducting pattern P by means of wire bonding. Thereafter as shown in FIG. 8J, the resistor R3 that is served as the emitter resistance is trimmed to adjust the output and the inductance element L3 that is served as the adjusting conducting pattern is trimmed to adjust the resonance frequency. In this case, adjusting of the resonance frequency is carried out on a rectangular divided piece that has not been divided into individual alumina substrate 1, and the ground electrodes are provided on corners of each alumina substrate 1. Therefore, ground electrodes (GND) are located always between input electrodes (Vcc, Vctl, and RFin) and output electrodes (RFout) located on adjacent alumina substrates 1, and as the result the adjustment of resonance frequency will not adversely affect the circuit of the adjacent alumina substrate 1.

Next, a shield cover 2 is fixed to each rectangular divided alumina substrate 1 and legs 2a of the shield cover 2 are soldered to the end side electrodes 3 that are connected to the ground electrodes (GND). Thereafter, the divided piece is cut along the dividing grooves extending in the other direction to form individual alumina substrates 1, and an electronic circuit as shown in FIG. 1 is thus obtained.

According to the electronic circuit unit in accordance with the above-mentioned embodiment having the structure as described hereinbefore, thin film circuit elements such as the capacitors C1 to C7, resistors R1 to R3, inductance elements L1 to L3, and conducting paths S1 and S2 and a thin film conducting pattern P that is connected to these circuit elements are formed on the alumina substrate 1, the semiconductor bare chip of the diode D1 and transistor Tr1 is fixed on the alumina substrate 1 by means of wire bonding, and end side electrodes 3 that is connected to ground electrodes and input/output electrodes of the conducting pattern are formed on the side surface of the alumina substrate 1. As the result, necessary circuit component elements can be mounted in high density on the alumina substrate 1 by means of thin film forming technique and wire bonding of semiconductor element, and the surface mounting type electronic circuit unit that is suitable for miniaturization is realized. Furthermore, because the area of the connection land on which the semiconductor bare chip 4 of the diode D1 and the transistor Tr1 is mounted is made smaller than the bottom surface area of the semiconductor bare chip 4, conductive adhesive applied on the connection land 5 such as cream solder or conductive paste can be retained inside the contour of the semiconductor bare chip 4, and it is prevented that the conductive adhesive spews from the contour of the semiconductor bare chip 4 to cause short-circuit to the surrounding conducting pattern P. Furthermore, because the connection land 5 has the opening 5a inside, the excessive conductive adhesive can be retained in the opening 5a, and the conductive adhesive is more surely prevented from spewing.

Figure 11:
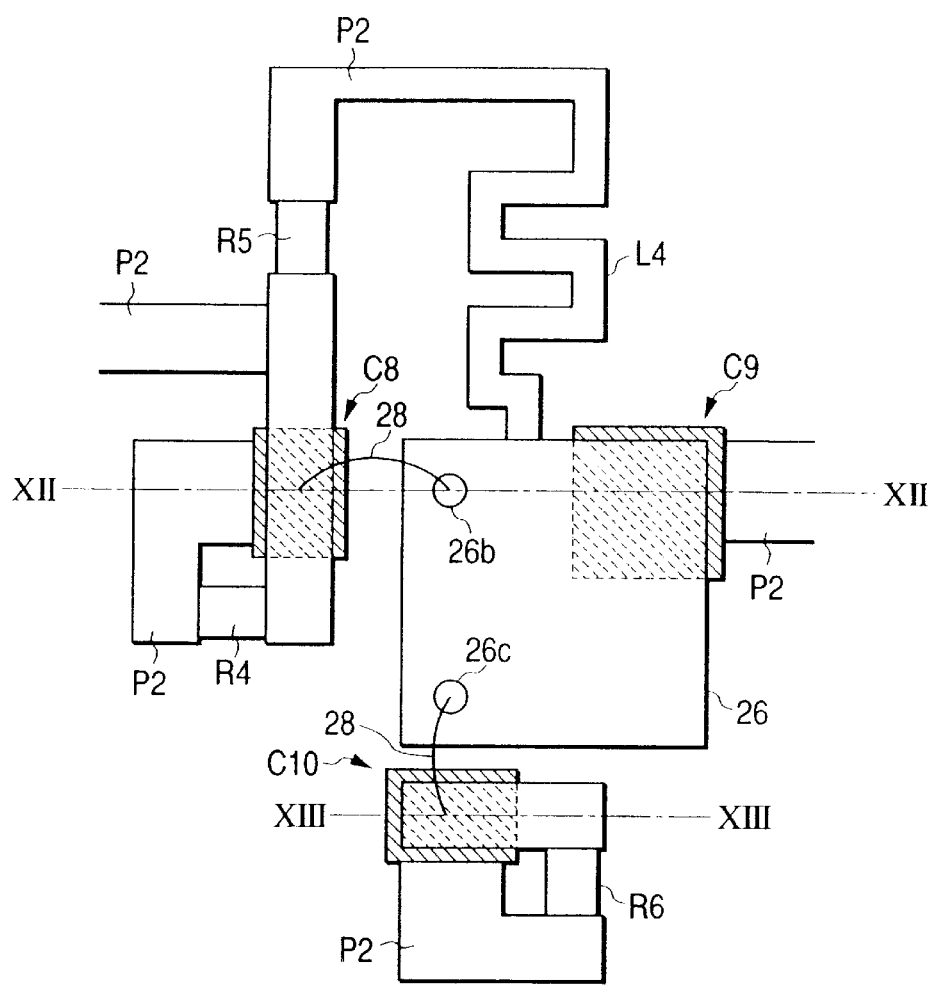
FIG. 11 is a partial plan view of an electronic circuit unit in accordance with an embodiment of the present invention.

Next, the second embodiment of the present invention will be described in detail hereinafter with reference to the drawings. FIG. 11 is a partial plan view of an electronic circuit unit in accordance with the present invention, FIG. 12 is a cross sectional view along the line XII—XII of FIG. 11, FIG. 13 is a cross sectional view along the line XIII—XIII of FIG. 11, and FIG. 14 is an explanatory view of a circuit structure.

Figure 14:
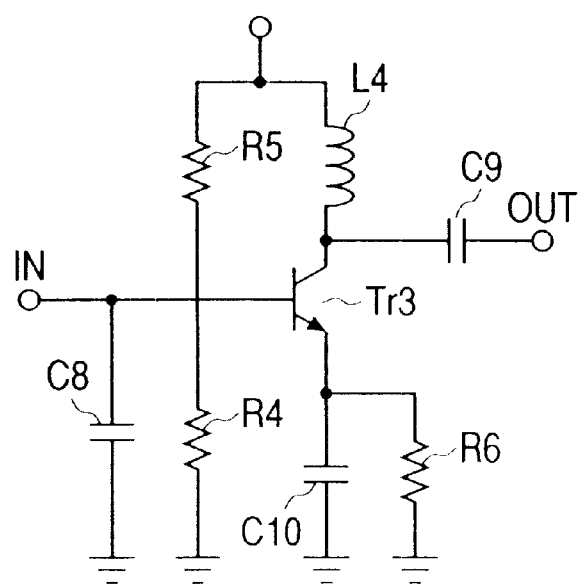
FIG. 14 is an explanatory view of a circuit structure.

The electronic circuit unit in accordance with the present embodiment is used as various high frequency devices, an electronic circuit unit is provided with an alumina substrate 21 on which, for example, an amplifier circuit shown in FIG. 14 is mounted. The amplifier circuit has circuit component elements such as capacitors C8 to C10, resistors R4 to R6, an inductance element L4, and a transistor Tr3 and a wiring pattern P2 used to connect these elements. As described hereinafter, the capacitors C8 to C10, resistors R4 to R6, inductance element L4, and wiring pattern P2 are formed by means of thin film process such as spattering or CVD, and the transistor Tr3 is mounted on the alumina substrate 21 by fixing a bare chip by means of wire-bonding. FIG. 14 shows only an exemplary circuit structure, and the present invention is applicable to an electronic circuit unit having a structure other than the above-mentioned structure.

Figure 12:
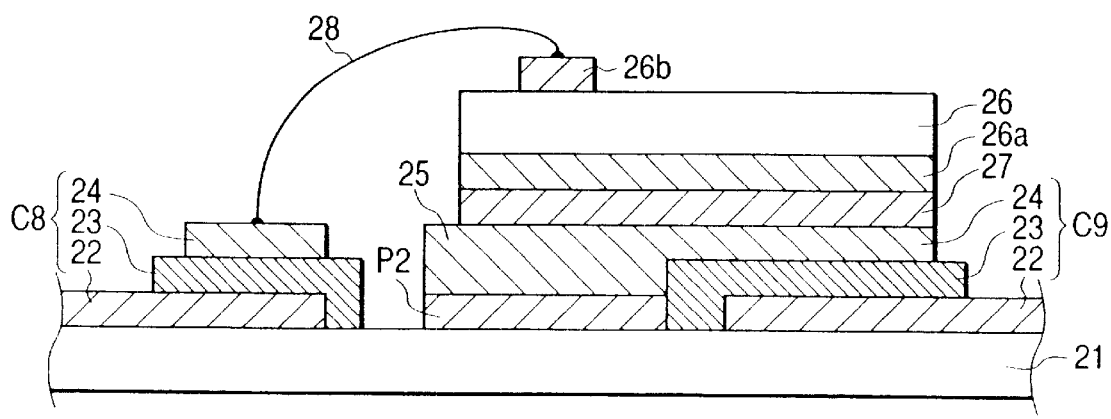
FIG. 12 is a cross sectional view along the line XII—XII of FIG. 11.
Figure 13:
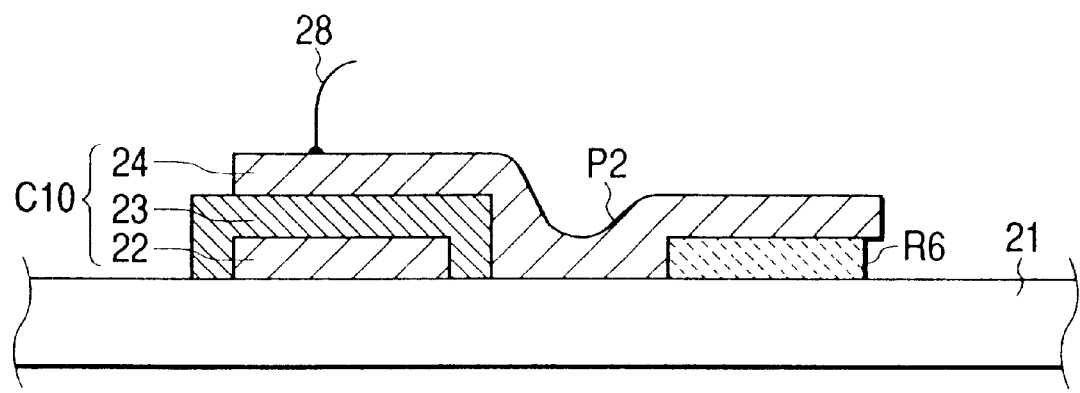
FIG. 13 is a cross sectional view along the line XIII—XIII of FIG. 11

As shown in FIG. 11 to FIG. 13, a bottom electrode 22, a dielectric film 23, and a top electrode 24 are laminated one on another on the surface of the alumina substrate 21 to thereby form three thin film capacitors corresponding to the capacitors C8 to C10, and the bottom electrodes 22 and the top electrodes 24 of the capacitors C8 to C10 are connected to the wiring pattern P2. The bottom electrodes 22, top electrodes 24, and wiring pattern P2, among these component elements, are formed of Ti/Cu conductive film by forming $SiO_2$ by means of thin film forming technique, and the dielectric film 23 is formed of dielectric film formed by means of thin film forming technique. Resistor films formed of $TaSiO_2$ corresponding to the resistors R4 to R6 and conductive film formed of Ti/Cu corresponding to the inductance element L4 are formed on the surface of the alumina substrate 21 by means of thin film forming technique, and both ends of these resistor films and conductive film are connected to the wiring pattern P2. Furthermore, a part of the wiring pattern P2 is served as the connection land 25, and the bare chip 26 of the transistor Tr3 is mounted on the connection land 25.

Among these capacitors C8 to C10, the top electrode 24 of the thin film capacitor corresponding to the capacitor C9 is served also as a part of the connection land 25, and the bottom side collector electrode 26a of the bare chip 26 is connected to the connection land 25 by use of conductive adhesive 27. In other words, the capacitor C9 is formed just under the mounting space of the bare chip 26 by means of thin film forming technique, the bare chip 26 and the capacitor C9 are overlapped one on the other. On the other hand, the residual capacitors C8 and C10 are served as the ground capacitors, the base electrode 26b and the emitter electrode 26c on the top side of the bare chip 26 are connected to the top electrodes 24 of the respective capacitors C8 and C10 through the wire 28. In other words, the bare chip 26 is connected to the top electrodes 24 of both ground capacitors C8 and C10 that are served as the bonding pad by means of wire bonding.

As described hereinabove, in the case of the electronic circuit unit in accordance with the above-mentioned embodiment, because the capacitor C9 is formed just under the space where the bare chip 26 of the transistor Tr3 is mounted by means of thin film forming technique and the top electrode 24 of the capacitor C9 is served also as a part of the connection land 25 of the bare chip 26, the areal efficiency is improved by the area corresponding to overlapped area of the bare chip 26 and the capacitor C9, and the lead inductance component between the bare chip 26 and the capacitor C9 is reduced to result in prevention of the high frequency characteristic deterioration. Furthermore, because the bare chip 26 is wire-bonded by use of the top electrodes 24 of the ground capacitors C8 and C10 as the bonding pad, the areal efficiency is more improved by the area corresponding to the area of the bonding pad. Both areal efficiency improvements of the bonding pad and the capacitor C9 bring about miniaturization of the electronic circuit unit, and the reduction of the lead inductance component between the bare chip 26 and the capacitors C8 and C10 brings about prevention of high frequency characteristic deterioration.

The present invention is applied as described in the above-mentioned embodiment and exhibits the effect described hereunder.

Circuit elements including capacitors, resistors, and inductance elements and conducting patterns connected to these circuit elements are formed on an alumina substrate by means of thin film forming technique, a semiconductor bare chip is fixed to the conducting pattern by means of wire bonding, and the area of the connection land on which the semiconductor bare chip is mounted is made smaller than the bottom surface area of the semiconductor bare chip. As the result, not only the necessary circuit parts are mounted in high density on the alumina substrate but also it is prevented that conductive adhesive spews from the contour of the semiconductor bare chip to cause short-circuit to the surrounding conducting pattern when the conductive bare chip is fixed to the connection land with conductive adhesive. Thus, the electronic circuit unit can be miniaturized.

The thin film capacitor is formed just under the mounting space of the semiconductor bare chip, the top electrode of the thin film capacitor is served also as a part of the connection land of the semiconductor bare chip, and the top electrode of the thin film capacitor is used as the bonding pad for wiring bonding the semiconductor bare chip. As the result, not only the improved areal efficiency of the substrate brings about the miniaturization of the electronic circuit unit but also the reduction of the lead inductance between the thin film capacitors and the semiconductor bare chip brings about prevention of the high frequency characteristic deterioration.

What is claimed is:

1. An electronic circuit unit comprising:
   an alumina substrate;
   a thin film conducting pattern formed on the alumina substrate;
   thin film circuit elements including capacitors, resistors, and inductance elements formed on the alumina substrate and connected to the conducting pattern; and
   a semiconductor bare chip wire bonded to the conducting pattern,
   wherein an area of a connection land on which the semiconductor bare chip is mounted is smaller than a bottom surface area of the semiconductor bare chip.

2. The electronic circuit unit according to claim 1, wherein at least two sides of the semiconductor bare chip are located apart from a contour of the connection land.

3. The electronic circuit unit according to claim 1, wherein an opening is formed in the connection land.

4. The electronic circuit unit according to claim 2, wherein an opening is formed in the connection land.

5. An electronic circuit unit comprising:
   a first capacitor formed by laminating a first bottom electrode and a first top electrode with interposition of a first dielectric material on a substrate, and
   a semiconductor bare chip mounted on the first capacitor,
   wherein the first top electrode serves as a part of a connection land connected to a bottom side electrode of the semiconductor bare chip.

6. The electronic circuit unit according to claim 5, wherein a second capacitor is formed by laminating a second bottom electrode and a second top electrode with interposition of second dielectric material on the substrate, wherein the second top electrode of the second capacitor is wire bonded to a top side electrode of the semiconductor bare chip.

* * * * *